United States Patent
Cheskis et al.

(10) Patent No.: US 9,874,086 B2
(45) Date of Patent: Jan. 23, 2018

(54) SYSTEM FOR DETERMINING POSITION OF MARKER DEPTH COORDINATES FOR CONSTRUCTION OF GEOLOGICAL MODEL OF DEPOSIT

(71) Applicant: OOO Rock Flow Dynamics, Moscow (RU)

(72) Inventors: Olga Andreevna Cheskis, Moscow (RU); Semen Leonidovich Tregub, Moscow (RU); Andrey Sergeevich Kazarov, Moscow (RU)

(73) Assignee: OOO Rock Flow Dynamics, Moscow (RU)

( * ) Notice: Subject to any disclaimer, the term of this patent is extended or adjusted under 35 U.S.C. 154(b) by 631 days.

(21) Appl. No.: 14/094,779

(22) Filed: Dec. 2, 2013

(65) Prior Publication Data

US 2014/0156193 A1    Jun. 5, 2014

(51) Int. Cl.
| | |
|---|---|
| *G01V 1/40* | (2006.01) |
| *E21B 47/04* | (2012.01) |
| *G01V 99/00* | (2009.01) |
| *G01V 11/00* | (2006.01) |
| *G01V 1/50* | (2006.01) |
| *G06F 17/50* | (2006.01) |

(52) U.S. Cl.
CPC ............... *E21B 47/04* (2013.01); *G01V 1/40* (2013.01); *G01V 1/50* (2013.01); *G01V 11/00* (2013.01); *G01V 99/005* (2013.01); *G01V 2210/60* (2013.01); *G06F 17/5009* (2013.01)

(58) Field of Classification Search
CPC .......... G01V 1/50; G01V 11/00; G01V 99/00; G01V 99/005; G01V 2210/60; E21B 47/04; E21B 47/09
USPC ........................................... 702/6, 11
See application file for complete search history.

(56) References Cited

U.S. PATENT DOCUMENTS

| | | | | |
|---|---|---|---|---|
| 4,320,469 A | * | 3/1982 | Frawley | G01V 11/002 367/33 |
| 6,012,017 A | * | 1/2000 | Van Bemmel | G01V 1/48 235/462.15 |
| 2007/0276604 A1 | | 11/2007 | Williams | |
| 2010/0004864 A1 | | 1/2010 | Thorne | |

(Continued)

FOREIGN PATENT DOCUMENTS

EA    200600036 A1    12/2008

*Primary Examiner* — An Do
(74) *Attorney, Agent, or Firm* — TransPacific Law Group; Pavel I. Pogodin, Esq.

(57) ABSTRACT

A system for building a geological model of oil or other mineral deposit. In particular, the system allows the coefficients of correlation to be determined for a set of well-logging curves and marker depth positions to be established for which the values of correlation coefficient are maximal. A technical result is the improvement of the accuracy of evaluating the parameters that are used to construct a geological model of location of oil or other deposits. The system makes it possible, given a marker, which already has its marks in a group of wells, which is referred to as reference group, to calculate such marks for wells from another group. For any well W where the marker depth is to be determined, wells from the reference group are chosen lying within the specified distance from the well W, and a well with the maximal coefficient of correlation is chosen among them.

2 Claims, 2 Drawing Sheets

(56) References Cited

U.S. PATENT DOCUMENTS

2014/0156192 A1* 6/2014 Cheskis ............... G01V 1/50
  702/6

* cited by examiner

SYSTEM FOR DETERMINING POSITION OF MARKER DEPTH COORDINATES FOR CONSTRUCTION OF GEOLOGICAL MODEL OF DEPOSIT

CROSS-REFERENCE TO RELATED PATENT APPLICATIONS

This U.S. patent application is related to the following U.S. patent applications filed on the same day: U.S. patent application Ser. No. 14/094,773 entitled "SYSTEMS AND METHODS FOR DETERMINING POSITION OF MARKER DEPTH COORDINATES FOR CONSTRUCTION OF GEOLOGICAL MODEL OF DEPOSIT," U.S. patent application Ser. No. 14/094,776 entitled "SYSTEMS AND METHODS FOR DETERMINING POSITION OF MARKER DEPTH COORDINATES FOR CONSTRUCTION OF GEOLOGICAL MODEL OF DEPOSIT," and U.S. patent application Ser. No. 14/094,783 entitled "SYSTEM FOR DETERMINING POSITION OF MARKER DEPTH COORDINATES FOR CONSTRUCTION OF GEOLOGICAL MODEL OF DEPOSIT," all of which are incorporated by reference herein in their entirety.

BACKGROUND OF THE INVENTION

Technical Field

The invention relates to a system for creating a geological model of oil or other mineral deposit. In particular, the system allows coefficients of correlation to be determined for a set of well log curves and marker depth positions to be established for which the value of correlation coefficient is maximal.

Description of the Related Art

Patent Publication No. EA 200600036 A1, E21B 7/04, 30 Dec. 2008 describes a program package to be stored in computer memory in a workstation or other computer system, designed for constructing a single-well model of a mineral deposit.

U.S. Patent Application Publication US 2007/0276604 A1, G01V 1/00, 29 Nov. 2007 presents a method for visualization and organization of data on oil and gas deposits. The method enables the processing of well log data with the use of raster images of well log records, which are digitized for the further placement of a marker on them.

U.S. Patent Application Publication No. US 2010/0004864 A1, G01V 9/00, 7 Jan. 2010 presents a method of correlation of well logs, involving automatically correlating data from a set of well log records, describing information in different land areas.

The aforesaid U.S. Patent Application Publication No. US 2010/0004864 describes the processing of data on wells that form a group and the implementing, with the use of special processing means, of correlation of data on the positions of those wells with the use of computation modules. However, the conventional systems fail to ensure highly accurate determinations of the location of mineral deposits, and in particular oil wells. In addition, the positions of marker depths cannot be calculated using the conventional systems.

Therefore, new and improved systems for generating high-accuracy geological models are needed.

SUMMARY OF THE INVENTION

The embodiments described herein are directed to methods and systems that substantially obviate one or more of the above and other problems associated with conventional systems for constructing of geological models.

In accordance with one aspect of the embodiments described herein, there is a provided a computerized system for determining a position of marker depth coordinates in the building of a geological model of a deposit, the computerized system comprising a module for determining a reference well group, a module for specifying the distances for the neighborhood of a group of wells, a module for evaluating correlation function, a module for choosing wells, a well testing module, for using tests to select wells meeting certain conditions, a module for determining the value of marker depth in a well, a module for updating the reference group, adding a newly found well to the reference group, and an iteration module related to the module for determining the reference well group, the module for determining correlation function, the module for specifying the distance and the module for choosing wells, wherein the iteration module is configured to enable a cyclic reiteration of the procedures of the module for determining the reference well group, the module for determining correlation function, the module for specifying the distance and the module for choosing wells until an information is obtained that no wells are found.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

Figure 1:
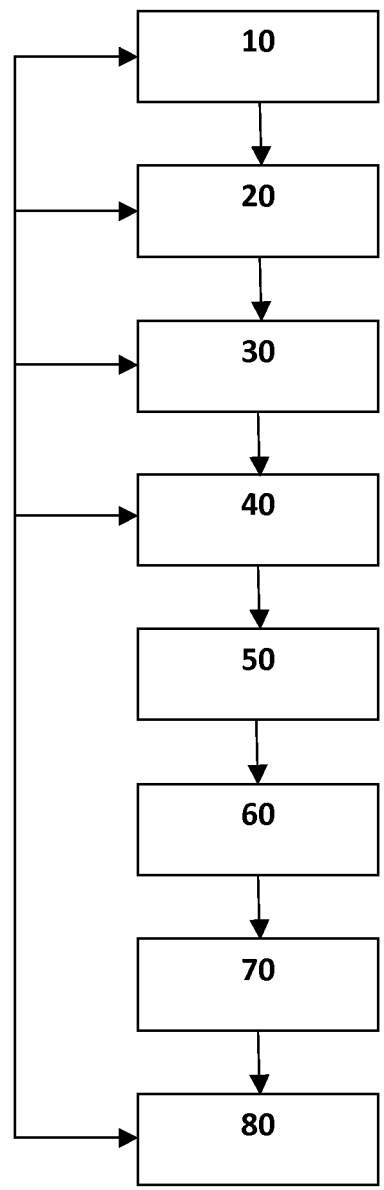
FIG. 1 illustrates an exemplary embodiment of a system for determining a position of marker depth coordinates in the building of a geological model of a deposit.

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense. Additionally, the various embodiments of the invention as described may be implemented in the form of a software running on a general purpose computer, in the form of a specialized hardware, or combination of software and hardware.

The problem addressed by one or more of the described embodiments of the invention is the building of a geological model capable of precisely determining the position of oil or other mineral deposits. Specifically, a technical result achieved by one or more embodiments described herein is the improvement of the accuracy of evaluation of the parameters that are used to construct a geological model of location of oil or other mineral deposits.

The problem of correlating sets of well log records implies the presence of a group of wells surveyed by logging methods at a level sufficient for stratigraphic and lithological analysis. Without loss of generality, it is assumed that such surveys result in a set of well log curves, containing a curve for each well in the group and for each method. An important step in the constructing of a geological model of a deposit is the tracing of boundaries of stratigraphic complexes or lithological features. Such boundaries can be identified along wells and extended to the area under study by interpolation. The boundaries, referred to as markers, have depth marks in wells at sites where well log curves show joint singularities.

The described embodiments of the inventive system make it possible to calculate coefficients of correlation for a set of logging curves for pairs of wells located within a specified distance from one another and to identify the positions of marker depth at which this coefficient is maximal.

The depths of markers are sought for wells that are not in the reference group for which such depths have been specified in advance. The described embodiments of the inventive system also enable reiteration of the search with the use of an iteration module, enabling the newly found wells to be included into the reference group at each iteration. The search is filtered by a testing module, which improves the calculation accuracy. In addition, the described embodiments of the inventive system can use trend markers, which enhance the efficiency of system application.

The described embodiments of the inventive system make it possible, given a marker, which already has its marks in a group of wells, which is referred to as reference group, to calculate such marks for wells from another group. For any well W where the marker depth is to be determined, wells from the reference group are chosen lying within the specified distance from well W, and a well with the maximal coefficient of correlation is chosen among them. Now, the point in well W in which this maximum is attained is taken as the required marker mark. With the result of the above algorithm assumed an iteration of a generalized algorithm and its result for a well added to the reference group after each iteration, the process is iterated until a blank result is obtained, i.e., the algorithm finds all wells where marker marks are available having been analyzed and identified in the given domain. Such looping of the main algorithm allows the solution to be obtained for many wells. To improve the reliability of calculations, a series of tests is added to the method to prevent the placing of markers in inappropriate points. The tests include correlation threshold, correlation quality, transitivity level, limitations on the values of function on a well.

FIG. 1 illustrates an exemplary embodiment of a system for determining a position of marker depth coordinates in the building of a geological model of a deposit. The system for evaluating correlation coefficients for a set of well-logging curves and locating marker depths includes module 10 for determining the reference well group, which determines wells W situated within a specified neighborhood of the reference well group; the neighborhood does not exceed the distance R from any well of the reference group, which is specified in module 20 for distance specifying; module 30 for evaluating correlation function C(z); module 40 for the choice of well, which chooses wells with maximal correlation coefficient for each found well W and establishes the corresponding point $z_{max}$ in well W; the latter module is associated with module 50 for checking well W, which uses test to select wells that satisfy specified conditions; module 60 for establishing the depth, which specifies the value of marker depth $z_{max}$ in well W that corresponds to maximum correlation value; module 70 for updating the reference group of wells, which adds the found well W to the reference well group; and iteration module 80, which interacts with module 10 for determining the reference well group, module 20 for distance specifying, module 30 for evaluating correlation function, and module 40 for the choice of well; the iteration module enables cyclic reiteration of the procedure of related modules until information is obtained that no well has been found.

The described embodiments of the inventive system solve the problem consisting in finding the depth of the marker by calculating the correlation coefficient of well-logging curves for pairs of wells, such that the problem has been already solved for one well in the pair. Namely, suppose that the depths of markers are known for a subgroup of wells, which are referred to as reference group. Then, choosing a reference well $W_0$ with marker depth $z_0$, we calculate for any well W, not in the reference group, the correlation function C(z), whose values are coefficients of correlation of a set of well log curves for the well W in point z and for the well $W_0$ in point $z_0$. Let us denote the maximum of this function by $z_{max}$. If for the well W, wells in the reference group have been found lying within its specified neighborhood, the depth $z_{max}$ corresponding to the reference well with the largest value of the maximum of function C(z), is taken as a possible depth of marker in the well W. The correlation function varies from −1 to 1; for one method of well logging, F is defined as $$C(z) = \frac{\int F_W(T(z+x)) F_{W_0}(z_0 + x) dx}{\sqrt{\int F_W^2(T(z+x)) dx} \sqrt{\int F_{W_0}^2(z_0 + x) dx}},$$

where $F_W$ and $F_{W_0}$ are curves of method F at wells W and $W_0$, respectively.

Figure 2:
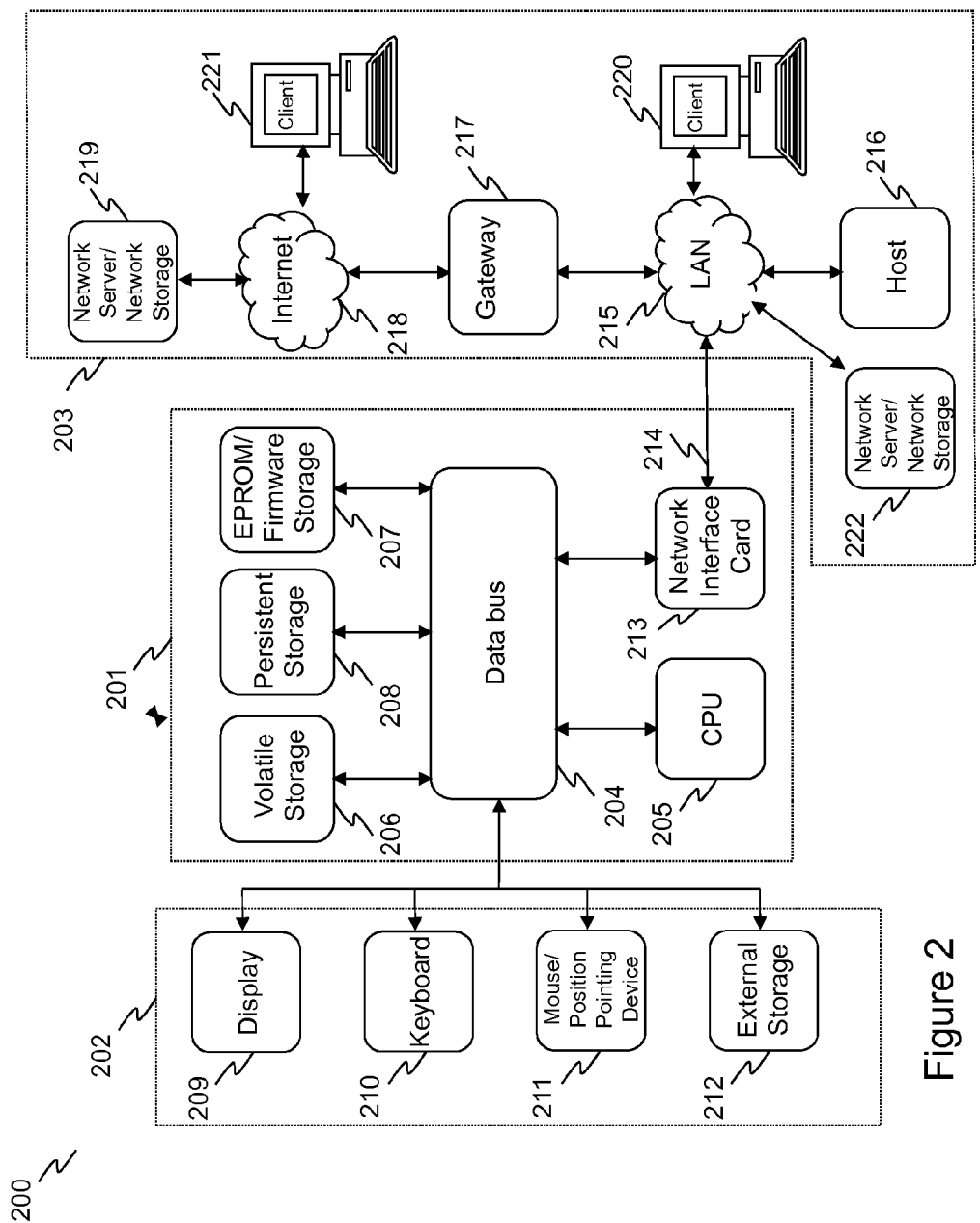
FIG. 2 is a block diagram that illustrates an exemplary embodiment of a computerized system upon which the described embodiments of the invention may be deployed.

Function T has the form T(z)=az+b, where a is not equal to 1 and b is nonzero only when one or two trend markers are specified, respectively. In such cases, a and b are calculated as a solution of a system of obvious linear equations. For a set of methods $\{F_i\}$, i=0, . . . , n, the correlation function is defined as $$C(z) = \frac{\sum_{i=0}^{n} w_i C_i(z)}{\sum_{i=0}^{n} w_i},$$

where $C_i(z)$ is the correlation function for method $F_i$, and $w_i$ are weight coefficients (FIG. 2).

The described embodiments of the inventive system may be used to find wells, lying within a specified neighborhood of the reference well group, i.e., located within distance R from a well from the reference group. The distance between the wells can be determined in several ways: as the distance between points of the wells at a certain depth, as the distance between points of the given marker, or as the distance between the points where the wells intersect a specified plane (FIG. 3).

Next, correlation function is calculated and for each well W identified at the previous step, a corresponding well $W_0$ is chosen from the reference group, such that correlation coefficient between them is maximal; then, a corresponding point $z_{max}$ in well W is identified.

Next, the well W, chosen at the previous step, is subjected to a series of tests, and, if the tests are successful, the choice of the well is approved and the depth $z_{max}$, corresponding to the maximal correlation, is taken as the depth of marker in well W (FIG. 4).

The approved wells W are added to the reference group, and the iteration module reiterates the functional operations until no well can be found (FIG. 5).

The tests used at the third step include:

1. The correlation function in point $z_{max}$ is to be in excess of a specified threshold value. Large threshold values improve the accuracy of the algorithm but reduce the number of wells found. For example, with the threshold value of 0.9 and the maximum correlation in point $z_{max}$ equal to 0.88, the well is classified as not meeting the test conditions.

2. The coefficient of quality of correlation in the point is to be in excess of the specified threshold value. The coefficient of quality of correlation is defined as a coefficient of deviation of the local maximum of correlation function, nearest in terms of value, from its largest local maximum in point $z_{max}$. Large values of this coefficient imply that the found maximum of correlation coefficient is appreciably higher than other local maximums of the correlation function. For example, if the maximal value of the correlation function is 0.9 and the maximum with nearest value is 0.89, the coefficient of quality of correlation will be (0.9−0.89)/0.9, that is, about 0.01. In this case, with the threshold value of the quality coefficient taken equal, for example, 0.5, the well will be classified as not meeting the test conditions.

3. The degree of transitivity is to be in excess of a specified threshold value. The degree of transitivity is defined as the number of previous iterations of the algorithm for which the maximum of the correlation function between the chosen reference well and the well of the current iteration satisfies the conditions of test 1. The test improves the reliability of the method. For example, if the threshold for the correlation function from test 1 has been taken equal to 0.9 and well A has passed the test for the correlation with well B from the reference group, and well B, in its turn, has been approved at its correlation with well C at the previous iteration, then the value of transitivity threshold equal 2 requires that the maximum of correlation function between well A and well C, as a reference well for A, be not less than 0.9. The threshold value of the degree of transitivity is taken equal to the number of previous iterations of the algorithm, if this number is less than the specified threshold value.

4. The values of the specified function for a well in the point of maximal correlation are to fall within a specified interval. This test allows the certainly poor sites to be rejected based on the values of some function containing appropriate information. As such function, the method can use, for example, the coherence function or the function of deviation of extremums of wavelet transform with increasing period.

FIG. 2 is a block diagram that illustrates an exemplary embodiment of a computer system 200 upon which the described invention may be deployed. The system 200 includes a computer platform 201, peripheral devices 202 and network resources 203.

The computer platform 201 may include a data bus 204 or other communication mechanism for communicating information across and among various parts of the computer platform 201, and a processor 205 coupled with bus 204 for processing information and performing other computational and control tasks. Computer platform 201 also includes a volatile storage 206, such as a random access memory (RAM) or other dynamic storage device, coupled to bus 204 for storing various information as well as instructions to be executed by processor 205, including the software application for proxy detection described above. The volatile storage 206 also may be used for storing temporary variables or other intermediate information during execution of instructions by processor 205. Computer platform 201 may further include a read only memory (ROM or EPROM) 207 or other static storage device coupled to bus 204 for storing static information and instructions for processor 205, such as basic input-output system (BIOS), as well as various system configuration parameters. A persistent storage device 208, such as a magnetic disk, optical disk, or solid-state flash memory device is provided and coupled to bus 204 for storing information and instructions.

Computer platform 201 may be coupled via bus 204 to a touch-sensitive display 109, such as a cathode ray tube (CRT), plasma display, or a liquid crystal display (LCD), for displaying information to a system administrator or user of the computer platform 201. An input device 210, including alphanumeric and other keys, is coupled to bus 204 for communicating information and command selections to processor 205. Another type of user input device is cursor control device 211, such as a mouse, a trackball, or cursor direction keys for communicating direction information and command selections to processor 205 and for controlling cursor movement on touch-sensitive display 209. This input device typically has two degrees of freedom in two axes, a first axis (e.g., x) and a second axis (e.g., y), that allows the device to specify positions in a plane. To detect user's gestures, the display 209 may incorporate a touchscreen interface configured to detect user's tactile events and send information on the detected events to the processor 205 via the bus 204.

An external storage device 212 may be coupled to the computer platform 201 via bus 204 to provide an extra or removable storage capacity for the computer platform 201. In an embodiment of the computer system 200, the external removable storage device 212 may be used to facilitate exchange of data with other computer systems.

The invention is related to the use of computer system 200 for implementing the techniques described herein. In an embodiment, the inventive system may reside on a machine such as computer platform 201. According to one embodiment of the invention, the techniques described herein are performed by computer platform 201 in response to processor 205 executing one or more sequences of one or more instructions contained in the volatile memory 206. Such instructions may be read into volatile memory 206 from another computer-readable medium, such as persistent storage device 208. Execution of the sequences of instructions contained in the volatile memory 206 causes processor 205 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 205 for execution. The computer-readable medium is just one example of a machine-readable medium, which may carry instructions for implementing any of the methods and/or techniques described herein. Such a medium may take many forms, including but not limited to, non-volatile media and volatile media. Non-volatile media includes, for example, optical or magnetic disks, such as the persistent storage device 208. Volatile media includes dynamic memory, such as volatile storage 206.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, an EPROM, a FLASH-EPROM, a flash drive, a memory card, any other memory chip or cartridge, or any other medium from which a computer can read.

Various forms of computer readable media may be involved in carrying one or more sequences of one or more instructions to processor 205 for execution. For example, the instructions may initially be carried on a magnetic disk from a remote computer. Alternatively, a remote computer can load the instructions into its dynamic memory and send the instructions over a telephone line using a modem. A modem local to computer system can receive the data on the telephone line and use an infra-red transmitter to convert the data to an infra-red signal. An infra-red detector can receive the data carried in the infra-red signal and appropriate circuitry can place the data on the data bus 204. The bus 204 carries the data to the volatile storage 206, from which processor 205 retrieves and executes the instructions. The instructions received by the volatile memory 206 may optionally be stored on persistent storage device 208 either before or after execution by processor 205. The instructions may also be downloaded into the computer platform 201 via Internet using a variety of network data communication protocols well known in the art.

The computer platform 201 also includes a communication interface, such as network interface card 213 coupled to the data bus 204. Communication interface 213 provides a two-way data communication coupling to a network link 214 that is coupled to a local network 215. For example, communication interface 213 may be an integrated services digital network (ISDN) card or a modem to provide a data communication connection to a corresponding type of telephone line. As another example, communication interface 213 may be a local area network interface card (LAN NIC) to provide a data communication connection to a compatible LAN. Wireless links, such as well-known 802.11a, 802.11b, 802.11g and Bluetooth may also used for network implementation. In any such implementation, communication interface 213 sends and receives electrical, electromagnetic or optical signals that carry digital data streams representing various types of information.

Network link 214 typically provides data communication through one or more networks to other network resources. For example, network link 214 may provide a connection through local network 215 to a host computer 216, or a network storage/server 222. Additionally or alternatively, the network link 214 may connect through gateway/firewall 217 to the wide-area or global network 218, such as an Internet. Thus, the computer platform 201 can access network resources located anywhere on the Internet 218, such as a remote network storage/server 219. On the other hand, the computer platform 201 may also be accessed by clients located anywhere on the local area network 215 and/or the Internet 218. The network clients 220 and 221 may themselves be implemented based on the computer platform similar to the platform 201.

Local network 215 and the Internet 218 both use electrical, electromagnetic or optical signals that carry digital data streams. The signals through the various networks and the signals on network link 214 and through communication interface 213, which carry the digital data to and from computer platform 201, are exemplary forms of carrier waves transporting the information.

Computer platform 201 can send messages and receive data, including program code, through the variety of network(s) including Internet 218 and LAN 215, network link 215 and communication interface 213. In the Internet example, when the system 201 acts as a network server, it might transmit a requested code or data for an application program running on client(s) 220 and/or 221 through the Internet 218, gateway/firewall 217, local area network 215 and communication interface 213. Similarly, it may receive code from other network resources.

The received code may be executed by processor 205 as it is received, and/or stored in persistent or volatile storage devices 208 and 206, respectively, or other non-volatile storage for later execution.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. For example, the described software may be implemented in a wide variety of programming or scripting languages, such as Assembler, C/C++, Objective-C, perl, shell, PHP, Java, as well as any now known or later developed programming or scripting language.

Moreover, other implementations of the invention will be apparent to those skilled in the art from consideration of the specification and practice of the invention disclosed herein. Various aspects and/or components of the described embodiments may be used singly or in any combination in the systems for constructing of geological models. It is intended that the specification and examples be considered as exemplary only, with a true scope and spirit of the invention being indicated by the following claims.

What is claimed is:

1. A computerized system for determining a position of marker depth coordinates in the building of a geological model of a deposit, the computerized system comprising a processing unit, a non-transitory computer-readable medium operatively coupled to the processing unit, a module for determining a reference well group, a module for specifying the distances for the neighborhood of a group of wells, a module for evaluating correlation function, a module for choosing wells, a well testing module, for using tests to select wells meeting certain conditions, a module for determining the value of marker depth in a well, a module for updating the reference group, adding a newly found well to the reference group, and an iteration module related to the module for determining the reference well group, the module for determining correlation function, the module for specifying the distance and the module for choosing wells, wherein the iteration module is configured to enable a cyclic reiteration of the procedures of the module for determining the reference well group, the module for determining correlation function, the module for specifying the distance and the module for choosing wells until an information is obtained that no wells are found, wherein the correlation function is defined as follows:

$$C(z) = \frac{\int F_W(T(z+x))F_{W_0}(z_0+x)dx}{\sqrt{\int F_W^2(T(z+x))dx}\sqrt{\int F_{W_0}^2(z_0+x)dx}},$$

where $F_W$ and $F_{W_0}$ are curves of a method F at wells W and $W_0$, respectively, z is a depth and $z_0$ is the marker depth.

2. A non-transitory computer-readable medium embodying a set of computer-executable instructions, executed in connection with a computerized system comprising a processing unit and a memory, the set of computer-executable instructions comprising: a module for determining a reference well group, a module for specifying the distances for the neighborhood of a group of wells, a module for evaluating correlation function, a module for choosing wells, a well testing module, for using tests to select wells meeting certain conditions, a module for determining the value of marker depth in a well, a module for updating the reference group, adding a newly found well to the reference group, and an iteration module related to the module for determining the reference well group, the module for determining correlation function, the module for specifying the distance and the module for choosing wells, wherein the iteration module is configured to enable a cyclic reiteration of the procedures of the module for determining the reference well group, the module for determining correlation function, the module for specifying the distance and the module for choosing wells until an information is obtained that no wells are found, wherein the correlation function is defined as follows:

$$C(z) = \frac{\int F_W(T(z+x))F_{W_0}(z_0+x)dx}{\sqrt{\int F_W^2(T(z+x))dx}\sqrt{\int F_{W_0}^2(z_0+x)dx}},$$

where $F_W$ and $F_{W_0}$ are curves of a method F at wells W and $W_0$, respectively, z is a depth and $z_0$ is the marker depth.

* * * * *